United States Patent
Chun et al.

(10) Patent No.: US 8,202,744 B2
(45) Date of Patent: Jun. 19, 2012

(54) WAFER THROUGH SILICON VIA FORMING METHOD AND EQUIPMENT THEREFOR

(75) Inventors: Jung Hwan Chun, Chungcheongnam-do (KR); Gyu Han Kim, Gyeonggi-do (KR)

(73) Assignee: STS Semiconductor & Telecommunications Co., Ltd. (KR)

( * ) Notice: Subject to any disclaimer, the term of this patent is extended or adjusted under 35 U.S.C. 154(b) by 364 days.

(21) Appl. No.: 12/512,813

(22) Filed: Jul. 30, 2009

(65) Prior Publication Data
US 2010/0279511 A1     Nov. 4, 2010

(30) Foreign Application Priority Data
May 4, 2009   (KR) .................. 10-2009-0038958

(51) Int. Cl.
*H01L 21/00* (2006.01)

(52) U.S. Cl. ..................... 438/26; 438/706; 438/719

(58) Field of Classification Search .................. None
See application file for complete search history.

(56) References Cited

U.S. PATENT DOCUMENTS

| | | | |
|---|---|---|---|
| 7,118,989 B2 | 10/2006 | Ramanathan et al. | |
| 2005/0082651 A1* | 4/2005 | Farnworth et al. | 257/678 |
| 2005/0202651 A1* | 9/2005 | Akram | 438/463 |
| 2007/0257373 A1* | 11/2007 | Akram et al. | 257/774 |

* cited by examiner

*Primary Examiner* — Duy Deo
(74) *Attorney, Agent, or Firm* — St. Onge Steward Johnston & Reens LLC

(57) ABSTRACT

Provided are a wafer through silicon via (TSV) forming method and equipment therefor. The wafer TSV forming method includes the operations of arranging a wafer having a front surface having a circuit area patterned thereon; recognizing locations of bond pads in the circuit area of the front surface of the wafer by using an image recognition camera, and converting the recognition of the locations into bond pad location information with respect to a back surface of the wafer; flipping the wafer; forming etching holes with middle depth in the back surface of the wafer by using a laser in a manner to match the locations of the bond pads by using the bond pad location information from the image recognition camera; and performing a plasma isotropic etching on the back surface having formed therein the etching holes with middle depth, thereby forming TSVs penetrating the bond pads.

11 Claims, 5 Drawing Sheets

WAFER THROUGH SILICON VIA FORMING METHOD AND EQUIPMENT THEREFOR

CROSS-REFERENCE TO RELATED APPLICATIONS

This application claims the benefit of Korean Patent Application No. 10-2009-0038958, filed on May 4, 2009, in the Korean Intellectual Property Office, the disclosure of which is incorporated herein in its entirety by reference.

FIELD OF THE INVENTION

The present invention relates to a method and equipment for manufacturing a semiconductor device, and more particularly, to a wafer through silicon via (TSV) forming method and equipment therefor so as to form a TSV in a bond-pad of a wafer having formed thereon a circuit pattern.

BACKGROUND OF THE INVENTION

Semiconductor devices evolved to be more minimized, to have larger storage capacity, and to be multifunctional. Recently, a multi chip package (MCP) having a structure formed by stacking the same or different semiconductor chips has been newly introduced.

In order to stack semiconductor chips on a semiconductor package, an MCP requires each semiconductor chip to be grinded to be thin, and requires a wire height to be low in a wire bonding process in which each semiconductor chip is electrically connected to a printed circuit board (PCB) included in the semiconductor package. Also, a die attach film used to attach each semiconductor chip has to be as thin as possible. However, in spite of all these efforts, since there is limit in stacking a plurality of semiconductor chips on one semiconductor package, research has been continuously conducted.

Meanwhile, in order to solve such a limit, a through silicon via (TSV) connecting method is developed to form a TSV in a bond pad of a semiconductor chip, to fill the TSV with a conductive material, and to vertically interconnect the semiconductor chips with another semiconductor chip, and is to be commercialized soon.

The aforementioned TSV connecting method for forming vias in a bond pad of a wafer by using a laser is disclosed in U.S. Pat. No. 7,118,989 (published on Oct. 16, 2006, introduced by Ramanathan, Shriram/Intel Corporation), entitled "Method of forming vias on a wafer stack using laser ablation".

SUMMARY OF THE INVENTION

The present invention provides a wafer through silicon via (TSV) forming method capable of forming a TSV in a wafer having high quality and low manufacturing costs without using an etch mask, and simultaneously performing a wafer TSV forming process and a grinding process for thinning the wafer.

The present invention also provides a wafer TSV forming equipment for the wafer TSV forming method.

According to an aspect of the present invention, there is provided a wafer TSV forming method including the operations of arranging a wafer having a front surface that has a circuit area patterned thereon; recognizing locations of bond pads in the circuit area of the front surface of the wafer by using an image recognition means, and converting the recognition of the locations into bond pad location information with respect to a back surface of the wafer; flipping the wafer; performing a first etching on the back surface of the wafer in a manner to match the locations of the bond pads by using the bond pad location information from the image recognition means, thereby forming etching holes with middle depth; and performing a second etching in an isotropic manner on the back surface having formed therein the etching holes with middle depth, thereby forming TSVs penetrating the bond pads.

The wafer may be selected from the group consisting of a single crystal silicon wafer, a compound semiconductor wafer, and a glass wafer, and the back surface of the wafer may be grinded to have a uniform thickness.

The image recognition means may include an image recognition camera. The first etching may be performed using a laser. The second etching may be performed without using an etch mask.

According to another aspect of the present invention, there is provided a wafer TSV forming method including the operations of arranging a wafer having a front surface that has a circuit area patterned thereon; recognizing locations of bond pads in the circuit area of the front surface of the wafer by using an image recognition camera, and converting the recognition of the locations into bond pad location information with respect to a back surface of the wafer; flipping the wafer; forming etching holes with middle depth in the back surface of the wafer by using a laser in a manner to match the locations of the bond pads accordingly by using the bond pad location information from the image recognition camera; and performing a plasma isotropic etching on the back surface having formed therein the etching holes with middle depth, thereby forming TSVs penetrating the bond pads.

According to another aspect of the present invention, there is provided a wafer TSV forming equipment including a loading portion supplying a wafer having a front surface that has a circuit area comprising bond pads patterned thereon; a pattern recognition portion recognizing locations of the bond pads of the wafer and converting the recognition of the locations into bond pad location information with respect to a back surface of the wafer; a first etching portion forming etching holes with middle depth on the back surface of the wafer by using the bond pad location information from the pattern recognition portion; a second etching portion performing a second etching on the back surface having the etching holes with middle depth formed by the first etching portion, and forming TSVs in the bond pads; and an unloading portion externally supplying the wafer having formed thereon TSVs through the bond pads via first and second etchings.

The pattern recognition portion may include an image recognition camera capable of recognizing the locations of the bond pads of the wafer.

The first etching portion may include a laser etching means, and the second etching portion may include a plasma etching means.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
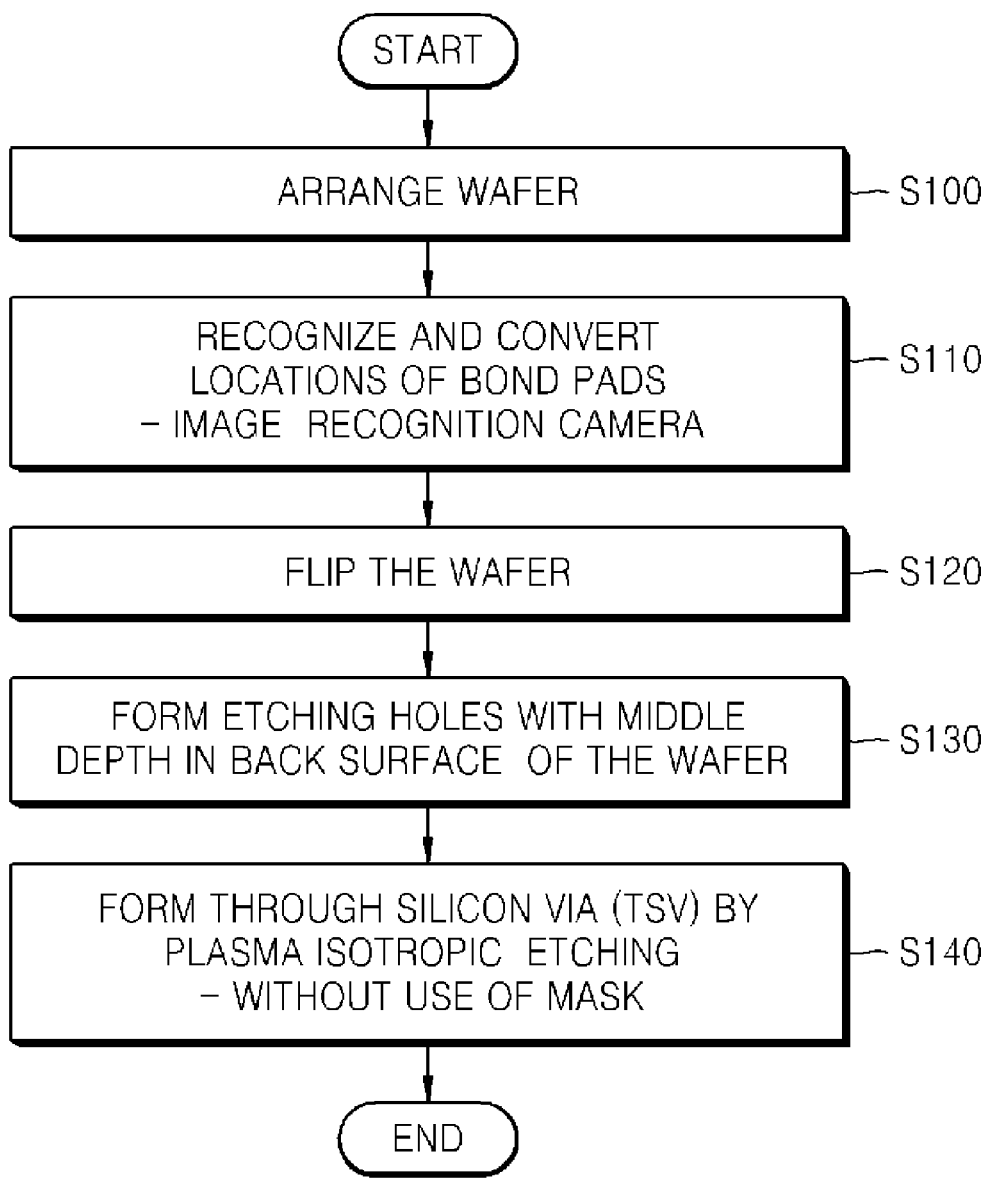
FIG. 1 is a flowchart of a wafer through silicon via (TSV) forming method according to an embodiment of the present invention.

FIG. 1 is a flowchart of a wafer through silicon via (TSV) forming method according to an embodiment of the present invention.

Referring to FIG. 1, first, a wafer is arranged (operation S100). The wafer is a semiconductor chip in a semiconductor package for a multi chip package (MCP). The wafer may have a back surface that is grinded and a front surface having a circuit area including bond pads patterned thereon via a wafer manufacturing process. Also, the wafer may not only be a generally-used single crystal silicon wafer but may instead be a compound semiconductor wafer or a glass wafer.

Next, locations of the bond pads formed on the front surface of the wafer are recognized using an image recognition camera. After that, the recognition of the locations is converted into bond pad location information with respect to the back surface of the wafer (operation S110). A technique involving recognizing, numerically representing, and converting location information about bond pads by using an image recognition means is widely used in a wire bonding equipment and various visual inspection systems, and thus a detailed description thereof is not provided here.

Next, the wafer having formed thereon the bond pads, in which the locations of the bond pads are recognized using the image recognition camera, is flipped so that the back surface of the wafer is shown (operation S120). After that, by using the bond pad location information obtained from the image recognition camera, etching holes having a middle depth are formed on the back surface of the wafer by performing a laser etching (operation S130). Then, TSVs that penetrate the bond pads of the wafer are formed by performing a plasma isotropic etching on the back surface of the wafer without using a mask (operation S140). Hereinafter, the wafer TSV forming method according to the present embodiment will now be described in detail with reference to detailed drawings.

Figure 2:
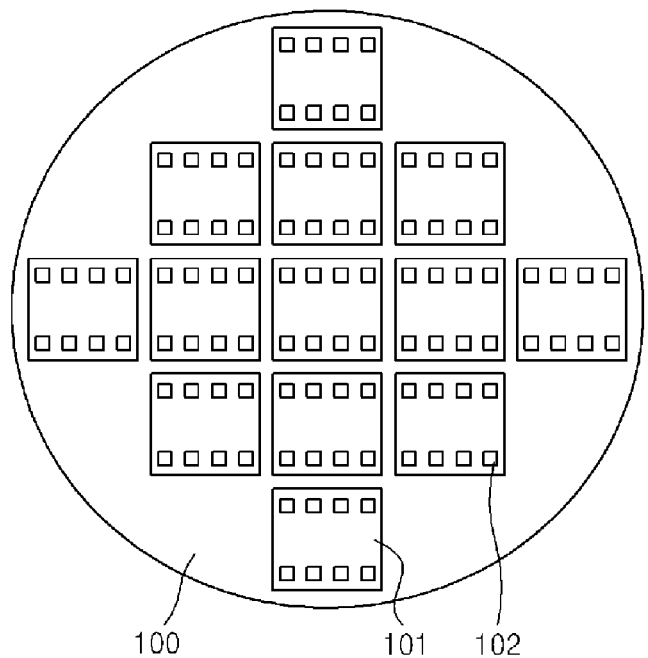
FIG. 2 is is a plane view of a wafer having a front surface having a circuit area patterned thereon.
Figure 3:
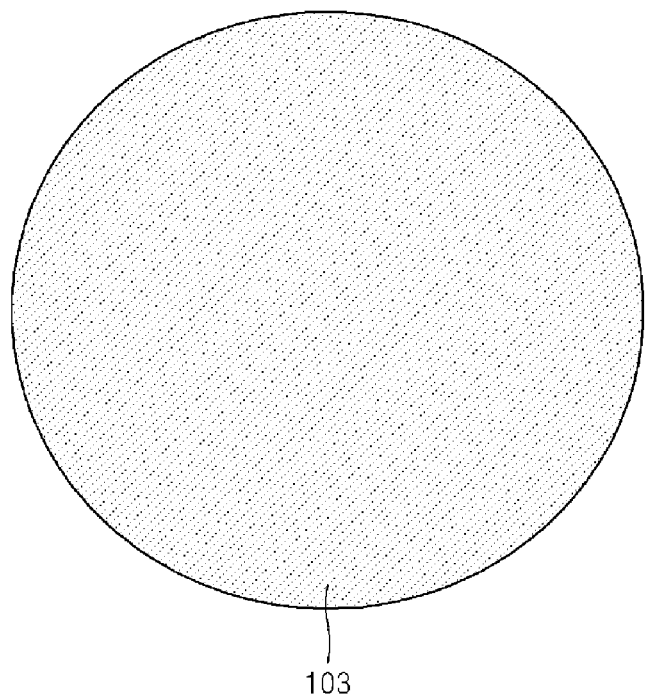
FIG. 3 is is a plane view of the wafer of FIG. 2, flipped.

FIG. 2 is a plane view of a wafer 100 having a front surface having a circuit area patterned thereon. FIG. 3 is a plane view of the wafer 100 of FIG. 2 flipped.

Referring to FIGS. 2 and 3, in general, several tens to several hundreds of semiconductor chips 101 are matrix-formed on the wafer 100, and each semiconductor chip 101 includes bond pads 102 that are paths for externally connecting functions of each semiconductor chip 101 and that have a constant shape.

Meanwhile, according to the present embodiment, information about locations (hereinafter, referred to as 'the location information') of the bond pads 102 from among patterns formed on a front surface of the wafer 100 is obtained by using an image recognition means such as an image recognition camera. After that, the location information of the bond pads 102 is numerically represented, and converted into bond pad location information corresponding to a back surface of the wafer 100. Such an image recognition and location information conversion technique is generally used in a wire bonder and various visual inspection systems, and thus, a detailed description thereof is not provided here. After that, as illustrated in FIG. 3, the wafer 100 is flipped to show a back surface 103. According to the present embodiment, although the bond pad location information with respect to the back surface of the wafer 100 is obtained using the image recognition means, the bond pad location information may be obtained using various other methods by one of ordinary skill in the art.

Figure 4:
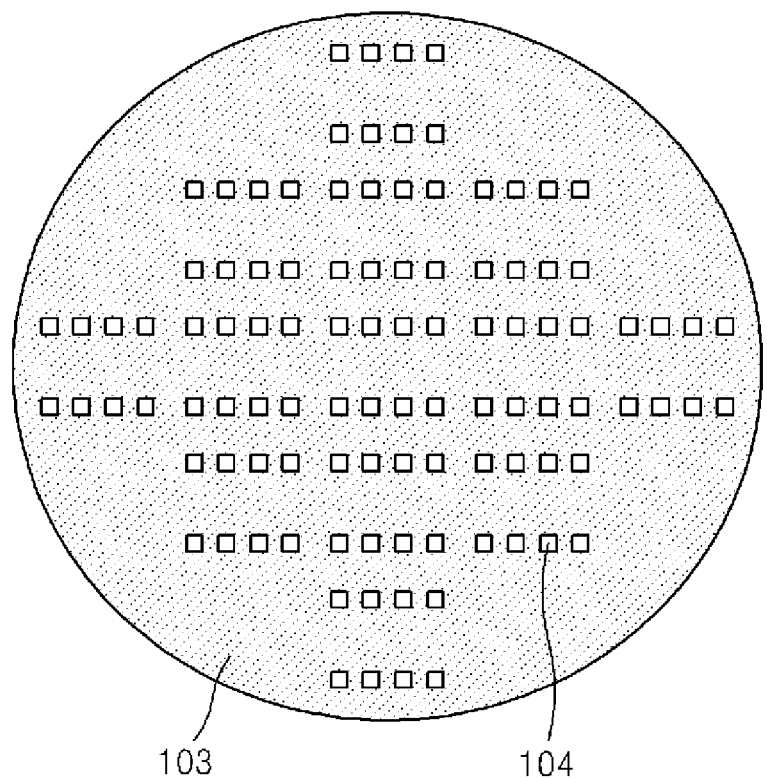
FIG. 4 is a plane view of a back surface of the wafer in FIG. 3, where a first etching is performed with a middle depth.
Figure 5:
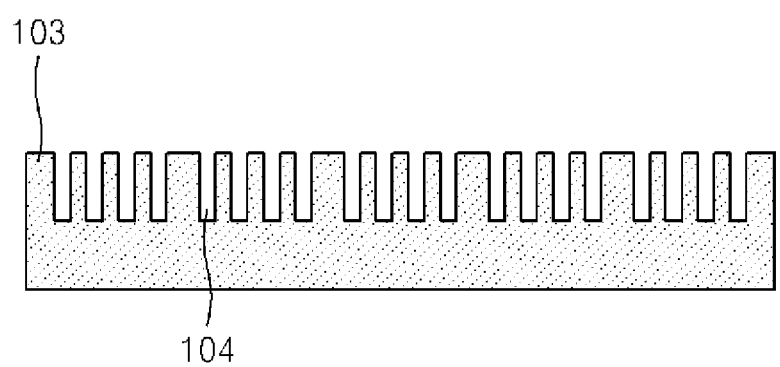
FIG. 5 is a cross-sectional view of the wafer of FIG. 4.

FIG. 4 is a plane view of the back surface 103 of the wafer 100 in FIG. 3, where a first etching is performed with a middle depth. FIG. 5 is a cross-sectional view of the wafer 100 of FIG. 4.

Referring to FIGS. 4 and 5, first etching holes 104 having a middle depth are formed in the back surface 103 of the wafer 100 in a manner to match the locations of the bond pads 102 by using the bond pad location information obtained by the image recognition means. The first etching holes 104 may be formed by a laser etching. However, in addition to the laser etching, the first etching holes 104 may be formed by a mechanical drilling or various other methods. Here, the middle depth of the first etching holes 104 means 10 through 90% thickness of the wafer 100.

Figure 6:
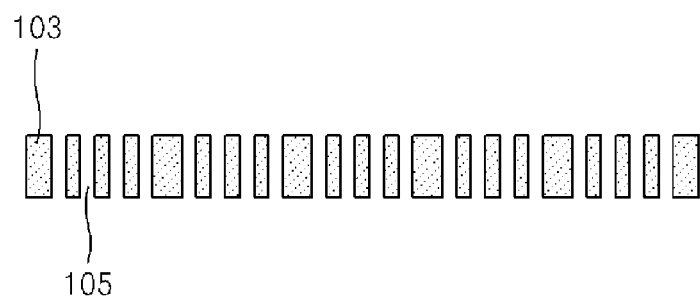
FIG. 6 is a cross-sectional view of the wafer of FIG. 5, in which TSVs are formed in bond pads by performing a second etching.
Figure 7:
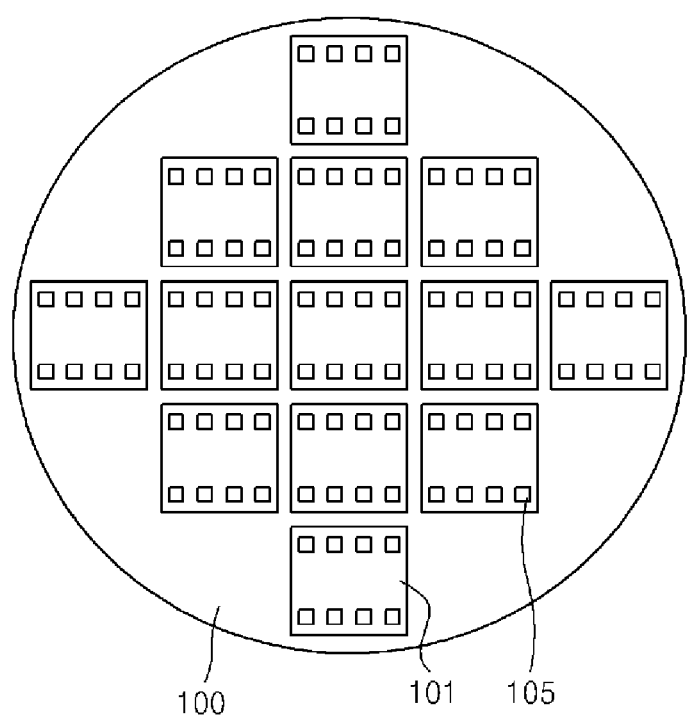
FIG. 7 is a plane view of a front surface of the wafer of FIG. 6.

FIG. 6 is a cross-sectional view of the wafer 100 of FIG. 5, in which TSVs 105 are formed through the bond pads 102 by performing a second etching. FIG. 7 is a plane view of the front surface of the wafer 100 of FIG. 6.

In order to form TSVs by a common plasma etching, photoresist is coated on a wafer, exposing and developing processes are performed on the photoresist to form a mask pattern, and then an etching is performed on the wafer. However, referring to FIGS. 6 and 7, according to the present embodiment, a plasma isotropic etching is performed on the back surface 103 of the wafer 100 without using a mask. Thus, the back surface 103 of the wafer 100 and the first etching holes 104 are etched an equal amount, in such a manner that the TSVs 105 are formed to be connected from the back surface 103 of the wafer 100 to the locations of the bond pads 102 at the front surface of the wafer 100.

In the case where a plurality of TSVs are formed to penetrate a wafer by a general laser etching, dimensions of the TSVs are not uniform. However, according to the present embodiment, since the TSVs 105 are finally formed by performing the plasma isotropic etching, dimensions of the TSVs 105 may be uniform. Also, according to common plasma etching, coating, developing, and exposing the photoresist are additionally performed to form the mask pattern. However, according to the present embodiment, since the TSVs 105 are finally formed without using the etching mask, a manufacturing process may be simplified and manufacturing costs may be reduced.

In addition, when the TSVs 105 are finally formed, since the thickness of the wafer 100 is reduced when the second etching, i.e., the plasma isotropic etching is performed on the wafer 100, a thinning effect with respect to the thickness of the wafer 100 may also be achieved via formation of the TSVs 105.

Figure 8:
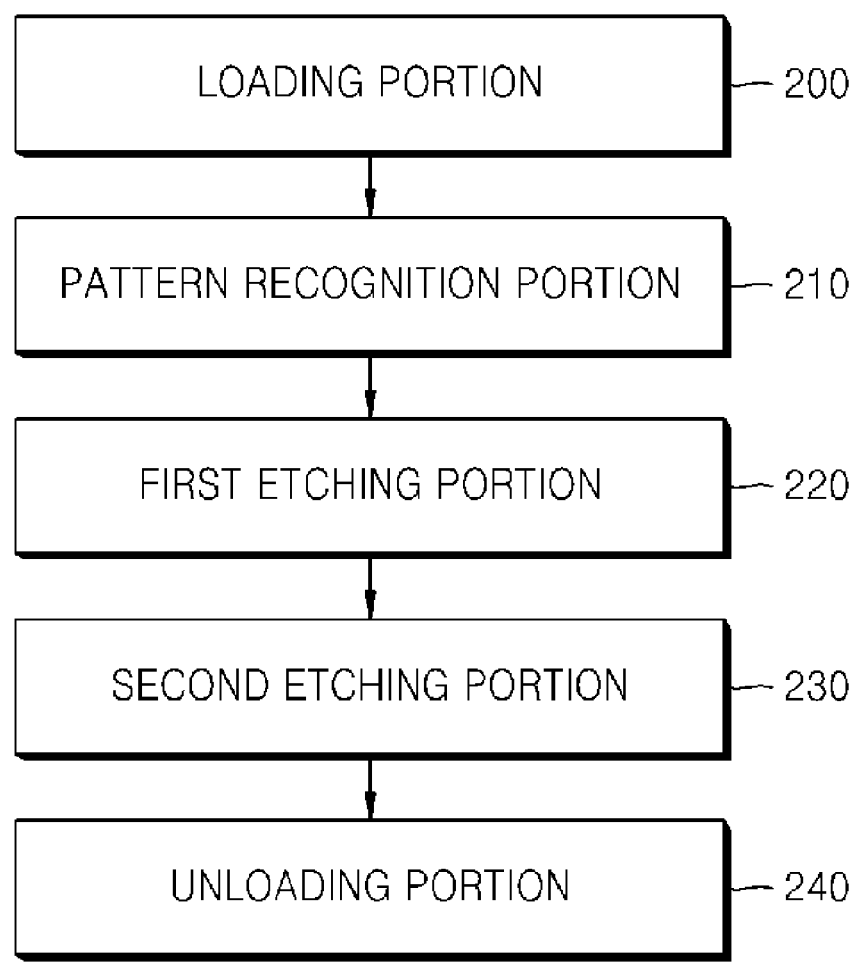
FIG. 8 is a block diagram of a wafer TSV forming equipment, according to an embodiment of the present invention.

FIG. 8 is a block diagram of a wafer TSV forming equipment, according to an embodiment of the present invention.

The processes described with reference to FIGS. 2 through 7 may be performed by the wafer TSV forming equipment, which is an inline wafer TSV forming equipment.

Referring to FIG. 8, the wafer TSV forming equipment according to the present embodiment includes a loading portion 200 supplying a wafer into the wafer TSV forming equipment, and a pattern recognition portion 210 arranged close to the loading portion 200. The pattern recognition portion 210 may function to recognize bond pads at a front surface of the wafer and to convert location information of the bond pads into bond pad location information with respect to a back surface of the wafer, and may have installed therein an image recognition camera.

The wafer TSV forming equipment according to the present embodiment includes a first etching portion 220 arranged close to the pattern recognition portion 210. The first etching portion 220 functions to form first etching holes with a middle depth at the back surface of the wafer by using the bond pad location information obtained from the pattern recognition portion 210. The first etching portion 220 may have installed therein a laser etching means capable of etching the back surface of the wafer by using a laser.

The wafer TSV forming equipment according to the present embodiment includes a second etching portion 230 arranged close to the first etching portion 220. The second etching portion 230 may include a plasma etching means capable of performing an isotropic etching on the back surface of the wafer without using an etch mask. Also, the wafer TSV forming equipment according to the present embodiment includes an unloading portion 240 externally supplying the wafer having formed thereon TSVs through the bond pads via first and second etchings.

According to the one or more embodiments of the present invention, first, in finally forming the TSVs in the wafer, plasma is used instead of a laser so that the dimensions of the TSVs may be uniform. Second, since the TSVs are formed by the plasma isotropic etching without using the etch mask so that processes of coating, developing, and exposing the photoresist, which are necessary in common plasma etching, may be omitted to simplify the manufacturing process and to reduce the manufacturing costs. Third, a wafer back surface grinding process for thinning the thickness of the wafer may be simultaneously performed when the TSVs are formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wafer TSV (through silicon via) forming method comprising:
    arranging a wafer having a front surface that has a circuit area patterned thereon;
    recognizing locations of bond pads in the circuit area of the front surface of the wafer by using an image recognition means, and converting the recognition of the locations into bond pad location information with respect to a back surface of the wafer;
    flipping the wafer;
    performing a first etching on the back surface of the wafer in a manner to match the locations of the bond pads by using the bond pad location information from the image recognition means, thereby forming etching holes with middle depth; and
    performing a second etching in an isotropic manner on the back surface having formed therein the etching holes with middle depth, thereby forming TSVs penetrating the bond pads.

2. The wafer TSV forming method of claim 1, wherein the wafer is selected from the group consisting of a single crystal silicon wafer, a compound semiconductor wafer, and a glass wafer.

3. The wafer TSV forming method of claim 1, wherein the back surface of the wafer is grinded to have a uniform thickness by the step of performing a second etching in an isotropic manner.

4. The wafer TSV forming method of claim 1, wherein the image recognition means comprises an image recognition camera.

5. The wafer TSV forming method of claim 1, wherein the first etching is performed using a laser.

6. The wafer TSV forming method of claim 1, wherein the second etching is performed without using an etch mask.

7. The wafer TSV forming method of claim 1, wherein the second etching is performed using a plasma.

8. A wafer TSV (through silicon via) forming method comprising:
    arranging a wafer having a front surface that has a circuit area patterned thereon;
    recognizing locations of bond pads in the circuit area of the front surface of the wafer by using an image recognition camera, and converting the recognition of the locations into bond pad location information with respect to a back surface of the wafer;
    flipping the wafer;
    forming etching holes with middle depth in the back surface of the wafer by using a laser in a manner to match the locations of the bond pads accordingly by using the bond pad location information from the image recognition camera; and
    performing a plasma isotropic etching on the back surface having formed therein the etching holes with middle depth, thereby forming TSVs penetrating the bond pads.

9. The wafer TSV forming method of claim 8, wherein the wafer is selected from the group consisting of a single crystal silicon wafer, a compound semiconductor wafer, and a glass wafer.

10. The wafer TSV forming method of claim 8, wherein the back surface of the wafer is grinded to have a uniform thickness by the step of performing a plasma isotropic etching.

11. The wafer TSV forming method of claim 8, wherein the plasma isotropic etching is performed without using an etch mask.

* * * * *